US010124565B2

(12) United States Patent
Di

(10) Patent No.: US 10,124,565 B2
(45) Date of Patent: Nov. 13, 2018

(54) GRAPHENE CONDUCTIVE FILM AND METHOD FOR FORMING THE SAME, AND FLEXIBLE TOUCH DEVICE

(71) Applicant: BOE TECHNOLOGY GROUP CO., LTD., Beijing (CN)

(72) Inventor: Yunping Di, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 173 days.

(21) Appl. No.: 14/909,630

(22) PCT Filed: Jul. 31, 2015

(86) PCT No.: PCT/CN2015/085726
§ 371 (c)(1),
(2) Date: Feb. 2, 2016

(87) PCT Pub. No.: WO2016/123940
PCT Pub. Date: Aug. 11, 2016

(65) Prior Publication Data
US 2016/0368250 A1    Dec. 22, 2016

(30) Foreign Application Priority Data
Feb. 3, 2015   (CN) .......................... 2015 1 0056811

(51) Int. Cl.
*B05D 5/12*      (2006.01)
*B32B 27/28*     (2006.01)
(Continued)

(52) U.S. Cl.
CPC .......... *B32B 27/281* (2013.01); *C01B 32/186* (2017.08); *C09D 1/00* (2013.01);
(Continued)

(58) Field of Classification Search
CPC combination set(s) only.
See application file for complete search history.

(56) References Cited

U.S. PATENT DOCUMENTS

| 3,846,269 | A | * | 11/1974 | Martello et al. | ...... C09D 5/4461 |
| | | | | | 204/493 |
| 6,277,485 | B1 | * | 8/2001 | Invie | ........................ C09D 4/00 |
| | | | | | 106/287.13 |

(Continued)

FOREIGN PATENT DOCUMENTS

| CN | 101430944 A | 5/2009 |
| CN | 101649055 A | 2/2010 |

(Continued)

OTHER PUBLICATIONS

Shinji Ando et al. "Wavelength Dependence of Refractive Indices of Polyimides in Visible and Near-IR Regions" (2002).*

(Continued)

*Primary Examiner* — Austin Murata
(74) *Attorney, Agent, or Firm* — Harness, Dickey & Pierce, P.L.C.

(57) ABSTRACT

The present disclosure provides a graphene conductive film, a method for forming the same and a flexible touch device. The method for forming a graphene conductive film includes: growing a graphene layer on a metal catalytic substrate; coating a PAA solution onto the graphene layer, and curing the PAA solution so as to form a PI film; and removing the metal catalytic substrate so as to form the graphene conductive film with the PI film.

10 Claims, 3 Drawing Sheets

(51) Int. Cl.
*C09D 179/08* (2006.01)
*G06F 3/041* (2006.01)
*H01B 1/04* (2006.01)
*C09D 1/00* (2006.01)
*C23C 16/26* (2006.01)
*C01B 32/186* (2017.01)

(52) U.S. Cl.
CPC ............ *C09D 179/08* (2013.01); *C23C 16/26* (2013.01); *G06F 3/041* (2013.01); *H01B 1/04* (2013.01); *B32B 2307/202* (2013.01); *B32B 2307/40* (2013.01); *B32B 2307/418* (2013.01); *C01B 2204/04* (2013.01); *C01B 2204/22* (2013.01); *G06F 2203/04102* (2013.01); *G06F 2203/04103* (2013.01)

(56) References Cited

U.S. PATENT DOCUMENTS

| | | | |
|---|---|---|---|
| 2012/0161192 A1 | 6/2012 | Kim et al. | |
| 2014/0037963 A1* | 2/2014 | Song | C01B 31/0446 428/408 |
| 2014/0134439 A1 | 5/2014 | Bergkvist | |
| 2014/0218867 A1* | 8/2014 | Kim | H05K 9/0088 361/704 |
| 2014/0238594 A1* | 8/2014 | Yoon | G02B 1/10 156/280 |
| 2015/0273737 A1* | 10/2015 | Chen | B29C 41/22 428/336 |
| 2016/0304352 A1* | 10/2016 | Ozyilmaz | C01B 31/0453 |

FOREIGN PATENT DOCUMENTS

| | | |
|---|---|---|
| CN | 101760724 A | 6/2010 |
| CN | 103140439 A | 6/2013 |
| CN | 103459315 A | 12/2013 |
| CN | 103778995 A | 5/2014 |
| CN | 104183299 A | 12/2014 |
| CN | 104192833 A | 12/2014 |

OTHER PUBLICATIONS

Second Office Action regarding Chinese application No. 201510259926.7, dated Aug. 22, 2016. Translation provided by Dragon Intellectual Property Law Firm.
Zinc Oxide Transparent Conductive Film and its Use, Yanghuaxin Touming Daodian Baomo, Jiqi Yingyong, (2011).
First Office Action regarding Chinese application No. 201510259926.7, dated Apr. 25, 2016. Translation provided by Dragon Intellectual Property Law Firm.
International Search Report and Written Opinion dated Oct. 30, 2015 regarding PCT/CN2015/085726. Translation provided by Dragon Intellectual Property Law Firm.
Notification of Reexamination regarding Chinese Patent Application No. 201510259926.7, dated Oct. 30, 2017. Translation provided by Dragon Intellectual Property Law Firm.

* cited by examiner

GRAPHENE CONDUCTIVE FILM AND METHOD FOR FORMING THE SAME, AND FLEXIBLE TOUCH DEVICE

CROSS-REFERENCE TO RELATED APPLICATION

This application is the U.S. national phase of PCT Application No. PCT/CN2015/085726 filed on Jul. 31, 2015, which claims a priority of the Chinese Patent Application No. 201510056811.8 filed on Feb. 3, 2015, the disclosures of which are incorporated in their entirety by reference herein.

TECHNICAL FIELD

The present disclosure relates to a graphene conductive film and a method for forming the same and a flexible touch device including the graphene conductive film.

BACKGROUND

Graphene is a plane film of $sp^2$-bonded carbon atoms that are densely packed in a hexagon honeycomb crystal lattice, which is a one-atom-thick two-dimensional material, and a thickness thereof is only 0.335 nanometer. Graphene is the thinnest and firmest nanometer material ever known. Graphene is almost transparent, and a light absorptivity thereof is only 2.3%. Graphene has a good thermal conductivity, and a thermal conductivity coefficient thereof is 5300 W/m·K. Graphene has a good electronic conductivity, and an electronic mobility thereof at a normal temperature is larger than 15000 $cm^2/V·s$, while an electrical resistivity thereof is only $10^{-6}$ Ω-cm, which is material of a smallest electrical resistivity ever known. Graphene has a high transmittance, a high conductivity, a high flexibility, a high mechanical strength and a high thermal conductivity, which has a great advantage as a transparent electrode of a flexible touch screen and a flexible display product.

At present, a large area of graphene film may be formed by chemical vapor deposition, wherein a graphene is grown on a metal catalytic base material firstly, and then the graphene is moved to a target base material by a proper method. At present, a main target base material is PET film, and a thickness thereof is 100-125 microns. In order to make a flexible touch screen lighter and thinner, a lighter and thinner target base material is needed. At present, polyimide (PI) film is one of the materials forming a flexible display apparatus. The PI film is of a high thermostability, capable of resisting high temperature and of a low thermal shrinkage rate. In addition, a chemical stability, a mechanical stability and an electrical insulation of the PI film are good, especially that a thickness of the PI film may even be 10 to 50 microns (generally 10-30 microns). The graphene may be transferred onto the PI film when the PI film is adopted, so as to form an ultra-thin flexible graphene transparent conductive film. However, if the graphene is transferred by the method in the prior art, a poor conductivity of the transferred graphene, a low yield and a high cost may be resulted due to a deformation of the base material or a process defect, when the graphene is transferred onto an ultra-thin PI film.

SUMMARY

In view of this, the present disclosure provides a graphene conductive film and a method for forming the same and a flexible touch device including the graphene conductive film, so as to prevent a deformation of the PI film, a low yield in the process of transferring the graphene and a poor conductivity of the transferred graphene.

To solve the problems hereinabove, the present disclosure provides the following technical schemes.

In one aspect, the present disclosure provides a method for forming a graphene conductive film, comprising:
growing a graphene layer on a metal catalytic substrate;
coating a polyamide acid (PAA) solution onto the graphene layer, and curing the PAA solution so as to form a polyimide (PI) film; and
removing the metal catalytic substrate so as to form the graphene conductive film with the PI film.

In some embodiments of the present disclosure, prior to removing the metal catalytic substrate, the method further comprises coating a protective solution onto a surface of the PI film and curing the protective solution so as to form an optical protective layer.

In some embodiments of the present disclosure, a refractive index of the optical protective layer is smaller than or equal to a refractive index of the PI film.

In some embodiments of the present disclosure, the PAA solution is a high-temperature-resistant PAA solution or a transparent PAA solution.

In some embodiments of the present disclosure, the PAA solution is cured by being heated or being subjected to a chemical reaction.

In some embodiments of the present disclosure, a thickness of the PI film is larger than 10 microns and smaller than 30 microns.

In some embodiments of the present disclosure, a thickness of the graphene layer is smaller than 1 nanometer.

In some embodiments of the present disclosure, a thickness of the graphene conductive film is larger than 10 microns and smaller than 30 microns.

In some embodiments of the present disclosure, the graphene layer is grown on the metal catalytic substrate by chemical vapor deposition.

In another aspect, the present disclosure further provides a graphene conductive film formed by the method hereinabove, wherein the graphene conductive film comprises a graphene layer and a PI film arranged on the graphene layer.

In some embodiments of the present disclosure, a thickness of the graphene layer is smaller than 1 nanometer.

In some embodiments of the present disclosure, a thickness of the PI film is larger than 10 microns and smaller than 30 microns.

In some embodiments of the present disclosure, a thickness of the graphene conductive film is larger than 10 microns and smaller than 30 microns.

In some embodiments of the present disclosure, the graphene conductive film further comprises an optical protective layer arranged on the PI film.

In some embodiments of the present disclosure, a refractive index of the optical protective layer is smaller than or equal to a refractive index of the PI film.

In yet another aspect, the present disclosure provides a flexible touch device comprising the graphene conductive film hereinabove.

According to the technical scheme hereinabove, in the method for forming a graphene conductive film, a graphene layer is grown on a metal catalytic substrate, and a PAA solution is coated onto a surface of the graphene and cured so as to form an ultra-thin PI film, and then the graphene conductive film with the ultra-thin PI film is formed. The method for forming a graphene conductive film provided by the present disclosure is simple, wherein it is not needed to transfer the graphene onto the PI film, thereby preventing a poor conductivity of the transferred graphene due to a deformation of the PI film in the process of transferring the graphene. In addition, a thickness of the graphene conductive film formed by the method provided by the present disclosure may be larger than 10 microns and smaller than 30 microns, and the conductivity thereof is good. In addition, according to the method for forming a graphene conductive film, it is not needed to transfer the graphene, so the method may be applied to a Roll to Roll or a Sheet to Sheet forming process so as to improve an efficiency of forming a graphene conductive film.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
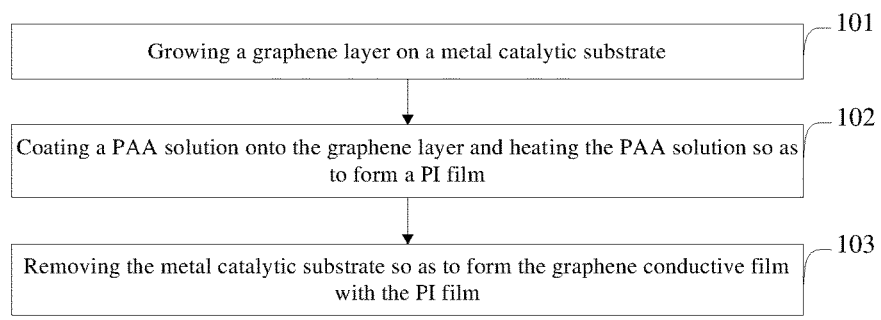
FIG. 1 is a flow chart of a method for forming a graphene conductive film according to some embodiments of the present disclosure.
Figure 2:
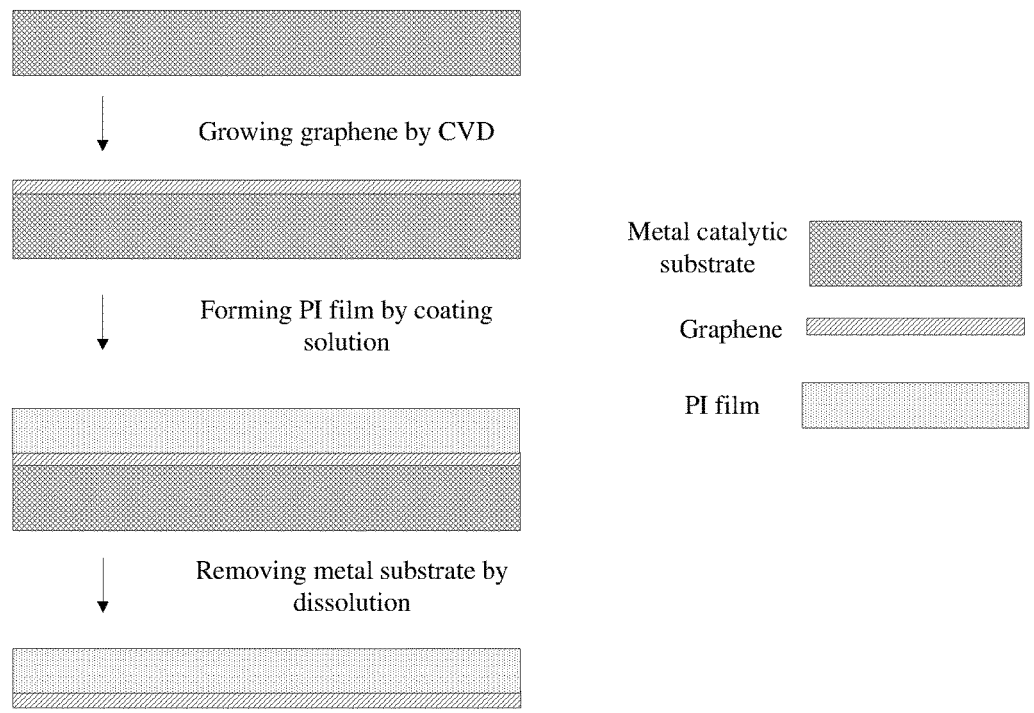
FIG. 2 is a schematic view showing a process of forming a graphene conductive film according to some embodiments of the present disclosure.

FIG. 1 is a flow chart of a method for forming a graphene conductive film according to some embodiments of the present disclosure, and FIG. 2 is a schematic view showing a process of forming a graphene conductive film according to some embodiments of the present disclosure. Referring to FIG. 1 and FIG. 2, the method includes the following steps.

Step 101: growing a graphene layer on a metal catalytic substrate.

The metal catalytic substrate used in the present disclosure may include any metal commonly known by those skilled in the art, and optionally, the metal catalytic substrate may include nickel and copper. For example, the step of growing the graphene layer on the metal catalytic substrate may be as follows. In some embodiments of the present disclosure, the metal catalytic substrate may include a copper foil. Firstly, a surface of the copper foil is cleaned, the copper foil is steeped into a solution mixed with acid and hydrogen peroxide to corrode the surface of the copper foil slightly, so as to detach particles adhered to the surface of the copper foil from the surface of the copper foil, and thus the surface of the copper foil may be cleaned effectively. After the copper foil is cleaned by a large amount of pure water, it is dried by compressed air. Then the cleaned copper foil is brought into a chemical vapor deposition device. A small amount of hydrogen is injected into the device to keep a normal air-pressure therein, and a temperature of the device may be risen to 1000 degree centigrade, then a thermal recovery may be performed on the copper foil. At last, a carbon-source gas is injected into the device. The carbon-source gas mainly includes hydrocarbon, such as alkane, olefin, arene and alcohol and other compounds. The carbon source used in the present embodiment is methane gas. A flow rate of the methane gas is set as 30-60 sccm, and a pressure of the methane gas is set as 400-600 mTorr, and the injection of the methane gas may last for 5-10 minutes. After then, a large amount of nitrogen is injected to cool the copper foil to a room temperature quickly, and then a high-quality graphene film is grown on the surface of the copper foil.

Step 102: coating a PAA solution onto the graphene layer and heat the PAA solution so as to form a PI film.

In some embodiments of the present disclosure, a concentration of the PAA solution, a type of a solvent and a way of coating are not limited, as long as a PI film having a thickness required in the present disclosure can be formed. Optionally, the PAA solution is coated in a Slot-die manner. For example, a PAA solution is onto a surface of the graphene film, and then the graphene film is brought into a Hot-VCD vacuum drying device so as to remove a large part of the solvent and pre-shape a wet film a thickness of which is, for example, limited to 50-300 microns. At last, the graphene film is brought into a heat treatment furnace, wherein a temperature of the heat treatment is set as 400-500 degree Celsius for example, and duration thereof is set as 30-60 minutes. The PAA is dehydrated in the process of heat treatment and then forms a closed-loop PI film.

Optionally, the PAA solution may further be cured to form the PI film by being subjected to a chemical reaction.

Step 103: removing the metal catalytic substrate so as to form the graphene conductive film with the PI film.

A solution for corroding the metal catalytic substrate of the graphene film may include a solution composed of an acid solution (e.g., nitric acid, phosphoric acid, acetic acid, and sulfuric acid) and a hydrogen peroxide, a ferric trichloride and a derivatization reagent thereof. In some embodiments of the present disclosure, the copper foil is etched by a solution composed of hydrogen peroxide and additive, and the corrosion solution is sprayed onto the copper foil to corrode the copper foil, and then the copper foil is cleaned by a large amount of pure water so as to prevent that the graphene film is polluted by impurities.

According to the method for forming a graphene conductive film in some embodiments of the present disclosure, a graphene layer is grown on a metal catalytic substrate, and a PAA solution is coated onto a surface of the graphene and cured so as to form an ultra-thin PI film, and then the graphene conductive film with the ultra-thin PI film is formed. The method for forming a graphene conductive film provided by the present disclosure is simple, wherein it is not needed to transfer the graphene onto the PI film, thereby preventing a poor conductivity of the transferred graphene due to a deformation of the PI film in the process of transferring the graphene. In addition, a thickness of the graphene conductive film (almost equal to the thickness of the PI film since the thickness of the graphene layer can be ignored) formed by the method provided by the present disclosure may be smaller than 30 microns, and the conductivity thereof is good. In addition, according to the above method, it is not needed to transfer the graphene, so the method may be applied to a Roll to Roll or Sheet to Sheet manufacturing process, so as to improve an efficiency of forming a graphene conductive film.

In addition, in some embodiments of the present disclosure, a lower limit of the thickness of the PI film is set as 10 micros (optionally 15 microns and further optionally 20 microns) in order to guarantee a performance and a mechanical strength of the PI film in the graphene conductive film.

Figure 3:
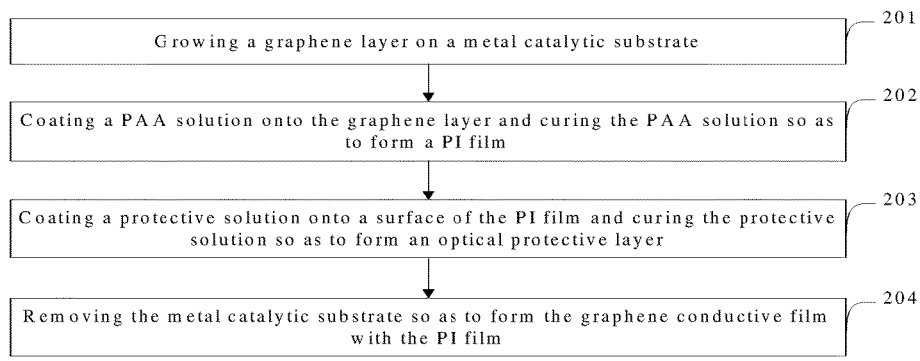
FIG. 3 is a flow chart of a method for forming a graphene conductive film according to some embodiments of the present disclosure.
Figure 4:
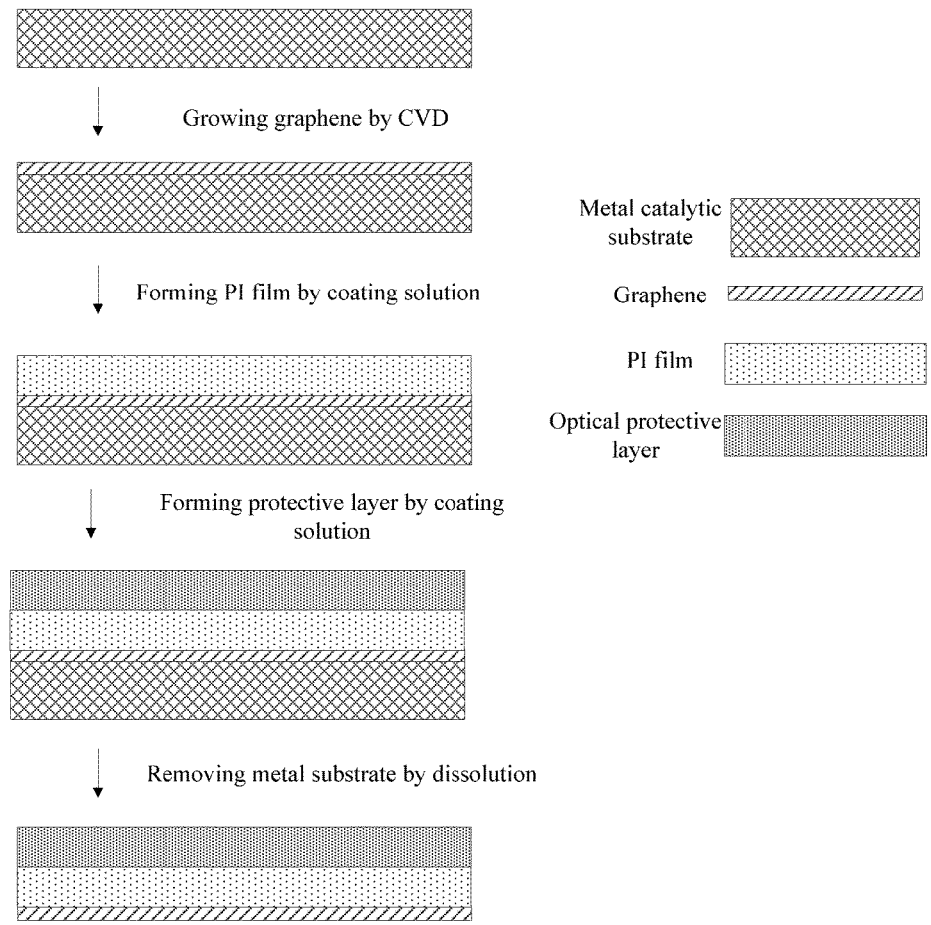
FIG. 4 is a schematic view showing a process of forming a graphene conductive film according to some embodiments of the present disclosure.

FIG. 3 is a flow chart of a method for forming a graphene conductive film according to some embodiments of the present disclosure. FIG. 4 is a schematic view showing a process of forming a graphene conductive film according to some embodiments of the present disclosure. Referring to FIG. 3 and FIG. 4, the method includes the following steps.

Step 201: growing a graphene layer on a metal catalytic substrate.

In Step 201, the graphene layer may be grown on the metal catalytic substrate by chemical vapor deposition. Of course, the graphene layer may be grown on the metal catalytic substrate by other methods. The specific process may refer to FIG. 4. A thickness of the graphene layer formed in Step 201 is smaller than one (1) nanometer.

Step 202: coating a PAA solution onto the graphene layer and cure the PAA solution so as to form a PI film.

In Step 202, the PAA solution may be a high-temperature-resistant PAA solution or a transparent PAA solution. The high-temperature-resistant PAA solution or the transparent PAA solution refers to the PAA solution by curing which a high-temperature-resistant PI film or a transparent PI film may be formed. In the process of curing the PAA solution to form the PI film, the PAA solution may be cured to form the PI film by being heated or being subjected to a chemical reaction according to the actual conditions, and the thickness of the PI film formed in this step is larger than 10 microns and smaller than 30 microns. A transmittance for visible light range of the high-temperature-resistant PI film is larger than 60%, and a temperature resistance is from 400 to 500 degree centigrade. A transmittance for visible light range of the transparent PI film is larger than 80%, and a temperature resistance is from 250 to 350 degree centigrade.

Step 203: coating a protective solution onto a surface of the PI film and cure the protective solution so as to form an optical protective layer.

In Step 203, in order to reduce a reflectivity and meanwhile increase a transmittance and protect the PI film from being scratched, prior to removing the metal catalytic substrate, the protective solution is coated onto the surface of the PI film and the protective solution is cured so as to form the optical protective layer. The optical protective layer has a high transmittance, and a refractive index of the optical protective layer is smaller than or equal to a refractive index of the PI film. Generally, the refractive index of the PI film is from 1.6 to 1.8, and the refractive index of the optical protective layer is from 1.4 to 1.6.

The optical protective layer is an optical protective film, which may increase a transmittance, reduce a reflectivity, be antifriction and resist corrosion. The optical protective film formed by the protective solution may protect the PI film from being scratched and meanwhile reduce the reflectivity and increase the transmittance, such that the graphene conductive film with the optical protective film may have a higher transmittance.

Such protective solution may be a known commercially available product, e.g., the antireflection type E2C OC (Overcoat) from the BASF Company. The solution may be coated uniformly onto the surface of the PI film by means of spray coating, spin coating or slot-die coating. In some embodiments of the present disclosure, the protective solution is sprayed uniformly onto the surface of the PI film, and the PI film with the protective solution is dried on a hot-plate for 2 to 10 minutes, and then it is heated in an annealing furnace. A heating temperature is from 120 to 250 degree centigrade, and the heating lasts for 30 to 60 minutes. The optical protective layer (optionally a fluorinated siloxane copolymer film) is formed by heating the PI film with the protective solution, and a thickness of the optical protective layer is from 45 to 55 nanometers, a refractive index thereof is from 1.4 to 1.5, and a transmittance for visible light is larger than 92%, and a pencil rigidity is larger than 5H.

Step 204: removing the metal catalytic substrate so as to form the graphene conductive film with the PI film and the optical protective layer.

In Step 204, the metal catalytic substrate may be removed by dissolution, so as to form the graphene conductive film with the ultra-thin PI film and the optical protective layer. A thickness of the graphene conductive film formed in some embodiments of the present disclosure (almost equal to the thickness of the PI film since the thickness of the graphene layer and the thickness of the optical protective layer can be ignored) is larger than 10 microns and smaller than 30 microns.

According to the method for forming a graphene conductive film in some embodiments of the present disclosure, a PAA solution is coated onto a surface of the graphene and cured so as to form an ultra-thin PI film, and then the graphene conductive film with the ultra-thin PI film is formed. The method for forming a graphene conductive film provided by the present disclosure is simple, wherein it is not needed to transfer the graphene onto the PI film, thereby preventing a severe deformation of the PI film and a low transferring yield thereof in the process of transferring the graphene and a poor conductivity of the transferred graphene. In addition, according to the method for forming a graphene conductive film in some embodiments of the present disclosure, by arranging the optical protective layer, the PI film may be further protected from being scratched and corroded, and a service life of the graphene conductive film may be increased. In addition, the optical protective layer has a high transmittance, and the refractive index of the optical protective layer is smaller than or equal to the refractive index of the PI film, so the optical protective film is further capable of reducing the reflection of light and increasing the transmittance of light.

In addition, the thickness of the graphene conductive film formed by the method according to the embodiments is larger than 10 microns and smaller than 30 microns, and conductivity thereof is good.

According to method for forming the graphene conductive film, it is not needed to transfer the graphene, so the method may be applied to a Roll to Roll or a Sheet to Sheet manufacturing process so as to improve an efficiency of forming a graphene conductive film.

Figure 5:
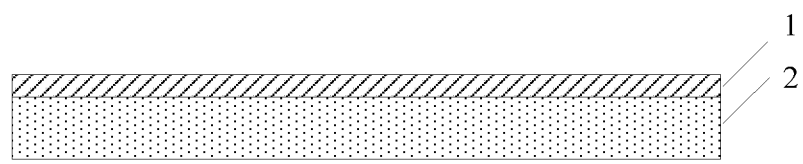
FIG. 5 is a schematic view showing a graphene conductive film according to some embodiments of the present disclosure.

FIG. 5 is a schematic view showing a graphene conductive film according to some embodiments of the present disclosure. Referring to FIG. 5, the graphene conductive film includes a graphene layer 1 and a PI film 2 arranged on the graphene layer 1.

A thickness of the graphene layer is smaller than 1 nanometer, and a thickness of the PI film is larger than 10 microns and smaller than 30 microns.

A thickness of the graphene conductive film formed in some embodiments of the present disclosure (i.e., the thickness of the PI film since the thickness of the graphene layer may be ignored) is larger than 10 microns and smaller than 30 microns, thereby meeting the requirement of the thickness of the conductive film by a touch screen apparatus, such that the touch screen or the flexible display apparatus formed by the graphene conductive film is thinner and the user experience is better.

Figure 6:
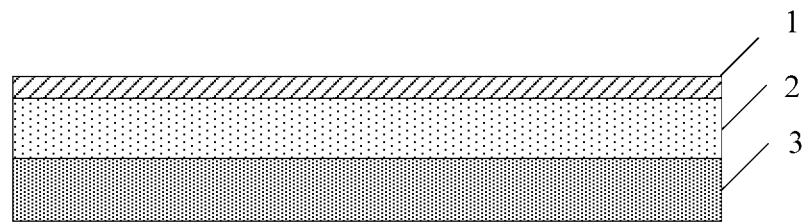
FIG. 6 is a schematic view showing a graphene conductive film according to some embodiments of the present disclosure.

FIG. 6 is a schematic view showing a graphene conductive film according to some embodiments of the present disclosure. Referring to FIG. 6, the graphene conductive film includes a graphene layer 1, a PI film 2 arranged on the graphene layer 1 and an optical protective layer 3 arranged on the PI film 2.

The optical protective layer 3 has a high transmittance, and a refractive index of the optical protective layer 3 is smaller than or equal to a refractive index of the PI film 2.

A thickness of the graphene conductive film formed in some embodiments of the present disclosure (i.e., the thickness of the PI film 2 since the thickness of the graphene layer 1 and the thickness of the optical protective layer 3 can be ignored) is larger than 10 microns and smaller than 30 microns, thereby meeting the requirement of the thickness of the conductive film by a touch screen apparatus, such that the touch screen or the flexible display apparatus formed by the graphene conductive film is thinner and the user experience is better.

Compared with the graphene conductive film provided by some of the above embodiments, in this embodiment, the optical protective layer is further provided in the graphene conductive film, thereby further protecting the PI film from being scratched and corroded and increasing a service life of the graphene conductive film. Furthermore, the optical protective layer has a high transmittance, and the refractive index of the optical protective layer is smaller than or equal to the refractive index of the PI film, so the optical protective film is further capable of reducing the reflection of light and increasing the transmittance of light.

A flexible touch device is provided by some embodiments of the present disclosure, including the graphene conductive film provided by the embodiments hereinabove.

Because the flexible touch device provided by some embodiments of the present disclosure applies the flexible graphene conductive film, it may be applied to all kinds of flexible display apparatus or wearable devices.

The above embodiments are merely to illustrate the technical scheme of the present disclosure rather than to limit. Although the embodiments are described above, those skilled in the art may understand that they may make modifications or alterations to these embodiments. These modifications and alterations may not make the present disclosure departed from its principle and spirit.

What is claimed is:

1. A method for forming a graphene conductive film, comprising:
   growing a graphene layer on a metal catalytic substrate;
   coating a polyamide acid (PAA) solution onto the graphene layer, and curing the PAA solution so as to form a polyimide (PI) film; and
   removing the metal catalytic substrate so as to form the graphene conductive film with the PI film;
   wherein, prior to removing the metal catalytic substrate, the method further comprises coating a protective solution onto a surface of the PI film and curing the protective solution so as to form an optical protective layer;
   wherein a refractive index of the optical protective layer is equal to a refractive index of the PI film.

2. The method according to claim 1, wherein the PAA solution is a high-temperature-resistant PAA solution or a transparent PAA solution.

3. The method according to claim 1, wherein the PAA solution is cured by being heated or being subjected to a chemical reaction.

4. The method according to claim 1, wherein a thickness of the PI film is larger than 10 microns and smaller than 30 microns.

5. The method according to claim 1, wherein a thickness of the graphene layer is smaller than 1 nanometer.

6. The method according to claim 1, wherein a thickness of the graphene conductive film is larger than 10 microns and smaller than 30 microns.

7. The method according to claim 1, wherein a thickness of the graphene conductive film is larger than 10 microns and smaller than 30 microns.

8. The method according to claim 1, wherein the graphene layer is grown on the metal catalytic substrate by chemical vapor deposition.

9. The method according to claim 1, wherein the PAA solution is a high-temperature-resistant PAA solution or a transparent PAA solution.

10. The method according to claim 1, wherein a thickness of the graphene layer is smaller than 1 nanometer.

\* \* \* \* \*